United States Patent
Joshi et al.

(10) Patent No.: US 12,040,118 B2
(45) Date of Patent: Jul. 16, 2024

(54) COOLING SYSTEM FOR A TRANSFORMER AND A METHOD OF COOLING A TRANSFORMER

(71) Applicant: Hamilton Sundstrand Corporation, Charlotte, NC (US)

(72) Inventors: Ashutosh Joshi, Roscoe, IL (US); Eric A. Carter, Monroe, WI (US); Debabrata Pal, Hoffman Estates, IL (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 520 days.

(21) Appl. No.: 17/106,713

(22) Filed: Nov. 30, 2020

(65) Prior Publication Data
US 2022/0172872 A1 Jun. 2, 2022

(51) Int. Cl.
*H01F 27/08* (2006.01)
*H01F 27/02* (2006.01)
*H02K 1/20* (2006.01)
*H02K 1/32* (2006.01)

(52) U.S. Cl.
CPC ........... *H01F 27/025* (2013.01); *H01F 27/08* (2013.01); *H02K 1/20* (2013.01); *H02K 1/32* (2013.01)

(58) Field of Classification Search
CPC ........ H01F 27/025; H01F 27/08; H01F 27/10; H01F 27/16; H02K 1/20; H02K 1/32; H05K 7/20927
USPC ..................................................... 336/55–62
See application file for complete search history.

(56) References Cited

U.S. PATENT DOCUMENTS

| | | | |
|---|---|---|---|
| 5,014,181 A | 5/1991 | Anderson et al. | |
| 7,129,808 B2 * | 10/2006 | Roebke | H01F 27/10 |
| | | | 336/60 |
| 9,230,726 B1 | 1/2016 | Parker et al. | |
| 9,812,243 B2 | 11/2017 | White et al. | |
| 9,888,591 B2 * | 2/2018 | Nakatsu | H05K 7/20 |
| 9,943,016 B2 | 4/2018 | Pietrantonio et al. | |
| 10,141,862 B1 | 11/2018 | Chen et al. | |
| 10,892,082 B2 | 1/2021 | Metzler et al. | |

(Continued)

FOREIGN PATENT DOCUMENTS

CN 110768522 A 2/2020

OTHER PUBLICATIONS

European Search Report for European Application No. 21202730.4; Report Mail Date Apr. 19, 2022; pp. 1-11.

*Primary Examiner* — Tuyen T Nguyen
(74) *Attorney, Agent, or Firm* — CANTOR COLBURN LLP

(57) ABSTRACT

A transformer includes a housing having a base wall, a first side wall, a second side opposing wall, a third side wall joining the first side wall and the second side wall at a first end including a first cooling channel joining the first side wall and the second side wall at a first end, and a fourth side wall including joining the first side wall and the second side wall at a second end. The first, second, third, and fourth side walls collectively define an interior portion. A cover extends across each of the first side wall the second side wall, the third side wall, and the fourth side wall. A cooling system includes a first cooling channel disposed in the third side wall, a second cooling channel disposed in the fourth side wall, and a third cooling channel disposed in the cover.

18 Claims, 6 Drawing Sheets

(56) References Cited

U.S. PATENT DOCUMENTS

| | | | |
|---|---|---|---|
| 2004/0264521 A1* | 12/2004 | Ness | H01F 27/10 |
| | | | 372/38.1 |
| 2010/0008112 A1 | 1/2010 | Feng et al. | |
| 2014/0313806 A1* | 10/2014 | Shinohara | H01L 23/473 |
| | | | 363/141 |
| 2020/0135378 A1 | 4/2020 | Joshi et al. | |

* cited by examiner

COOLING SYSTEM FOR A TRANSFORMER AND A METHOD OF COOLING A TRANSFORMER

BACKGROUND

Exemplary embodiments pertain to the art of transformers and, more particularly, to a conductive cooling system for an interphase transformer.

Many power systems employ rectifier circuits that convert alternating current power into direct current power having a high voltage such as 270 VDC. In some systems, the rectifier circuit may be paired with a transformer to form a transformer-rectifier unit. In high-current aviation applications, the high current may result in the need to provide one or more transformer-rectifier units connected in parallel. To smooth the output of these parallel connected units, an interphase transformer is often employed. Interphase transformers include layers of overlapping electrically conductive windings that carry electrical current. As the current flows through the windings, heat is produced.

In high current applications, the interphase transformer produces high levels of heat that may impact energy production. In order to maintain performance, the interphase transformers include cooling systems that are arranged to reduce and/or remove heat from the windings. In most cases, the cooling systems take the form of immersion cooling systems in which a flow of coolant is placed in direct contact with the windings. Given the direct contact, the choice of coolant is limited. Accordingly, the industry would welcome a cooling system for an interphase transformer that allows for increased coolant options.

BRIEF DESCRIPTION

Disclosed is a transformer including a housing having a base wall, a first side wall, a second side opposing wall, a third side wall joining the first side wall and the second side wall at a first end including a first cooling channel joining the first side wall and the second side wall at a first end, and a fourth side wall including joining the first side wall and the second side wall at a second end. The first, second, third, and fourth side walls collectively define an interior portion. A cover extends across each of the first side wall the second side wall, the third side wall, and the fourth side wall. A cooling system includes a first cooling channel disposed in the third side wall, a second cooling channel disposed in the fourth side wall, and a third cooling channel disposed in the cover. The third cooling channel is fluidically connected to at least one of the first cooling channel and the second fooling channel.

Additionally, or alternatively, in this or other embodiments, the third cooling channel includes a first cooling circuit fluidically connected to the first cooling channel and a second cooling circuit fluidically connected to the second cooling channel.

Additionally, or alternatively, in this or other embodiments, the first cooling channel includes a first coolant path and a second coolant path and the second coolant channel includes a third coolant path and a fourth coolant path.

Additionally, or alternatively, in this or other embodiments, the first cooling circuit includes an inlet fluidically connected to the first coolant path and an outlet fluidically connected to the first coolant path.

Additionally, or alternatively, in this or other embodiments, the second cooling circuit includes an inlet section fluidically connected to the third coolant path and an outlet section fluidically connected to the third coolant path.

Additionally, or alternatively, in this or other embodiments, the first cooling circuit is directly fluidically connected to the first cooling channel and the second cooling circuit is directly fluidically connected to the second cooling channel.

Additionally, or alternatively, in this or other embodiments, the first cooling circuit is fluidically connected to the first cooling channel via a first conduit and the second cooling circuit is fluidically connected to the second cooling channel via a second conduit.

Additionally, or alternatively, in this or other embodiments, the first conduit passes externally of the housing and the second conduit passes externally of the housing.

Also disclosed is an electrical generation system including a heat exchanger, a pump fluidically connected to the heat exchanger, a generator including a cooling circuit is fluidically connected to the pump, and a transformer is electrically connected to the generator and fluidically connected to the pump. The transformer includes a housing having a base wall, a first side wall, a second side opposing wall, a third side wall joining the first side wall and the second side wall at a first end including a first cooling channel joining the first side wall and the second side wall at a first end, and a fourth side wall including joining the first side wall and the second side wall at a second end. The first, second, third, and fourth side walls collectively define an interior portion. A cover extends across each of the first side wall the second side wall, the third side wall, and the fourth side wall. A cooling system includes a first cooling channel disposed in the third side wall, a second cooling channel disposed in the fourth side wall, and a third cooling channel disposed in the cover. The third cooling channel is fluidically connected to at least one of the first cooling channel and the second fooling channel.

Additionally, or alternatively, in this or other embodiments, the third cooling channel includes a first cooling circuit fluidically connected to the first cooling channel and a second cooling circuit fluidically connected to the second cooling channel.

Additionally, or alternatively, in this or other embodiments, the first cooling channel includes a first coolant path and a second coolant path and the second coolant channel includes a third coolant path and a fourth coolant path.

Additionally, or alternatively, in this or other embodiments, the first cooling circuit includes an inlet fluidically connected to the first coolant path and an outlet fluidically connected to the first coolant path.

Additionally, or alternatively, in this or other embodiments, the second cooling circuit includes an inlet section fluidically connected to the third coolant path and an outlet section fluidically connected to the third coolant path.

Additionally, or alternatively, in this or other embodiments, the first cooling circuit is directly fluidically connected to the first cooling channel and the second cooling circuit is directly fluidically connected to the second cooling channel.

Additionally, or alternatively, in this or other embodiments, the first cooling circuit is fluidically connected to the first cooling channel via a first and the second cooling circuit is fluidically connected to the second cooling channel via a second conduit.

Additionally, or alternatively, in this or other embodiments, the first conduit passes externally of the housing and the second conduit passes externally of the housing.

Further disclosed is a method of cooling a transformer having a housing including passing a cooling fluid into a first cooling channel formed in a first side wall of the housing, and flowing the cooling fluid from the first cooling channel into another cooling channel formed in a cover for the housing.

Additionally, or alternatively, in this or other embodiments, the method further includes passing the cooling fluid into a second cooling channel formed in a second side wall of the housing; and flowing the cooling fluid from the second coolant channel into yet another cooling channel formed in the cover.

Additionally, or alternatively, in this or other embodiments, flowing the cooling fluid into another cooling channel includes passing the cooling fluid directly from the first cooling channel into the another cooling channel.

Additionally, or alternatively, in this or other embodiments flowing the cooling fluid into another cooling channel includes passing the cooling fluid from the first cooling channel externally of the housing through a conduit and then into the another cooling channel.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

Figure 1:
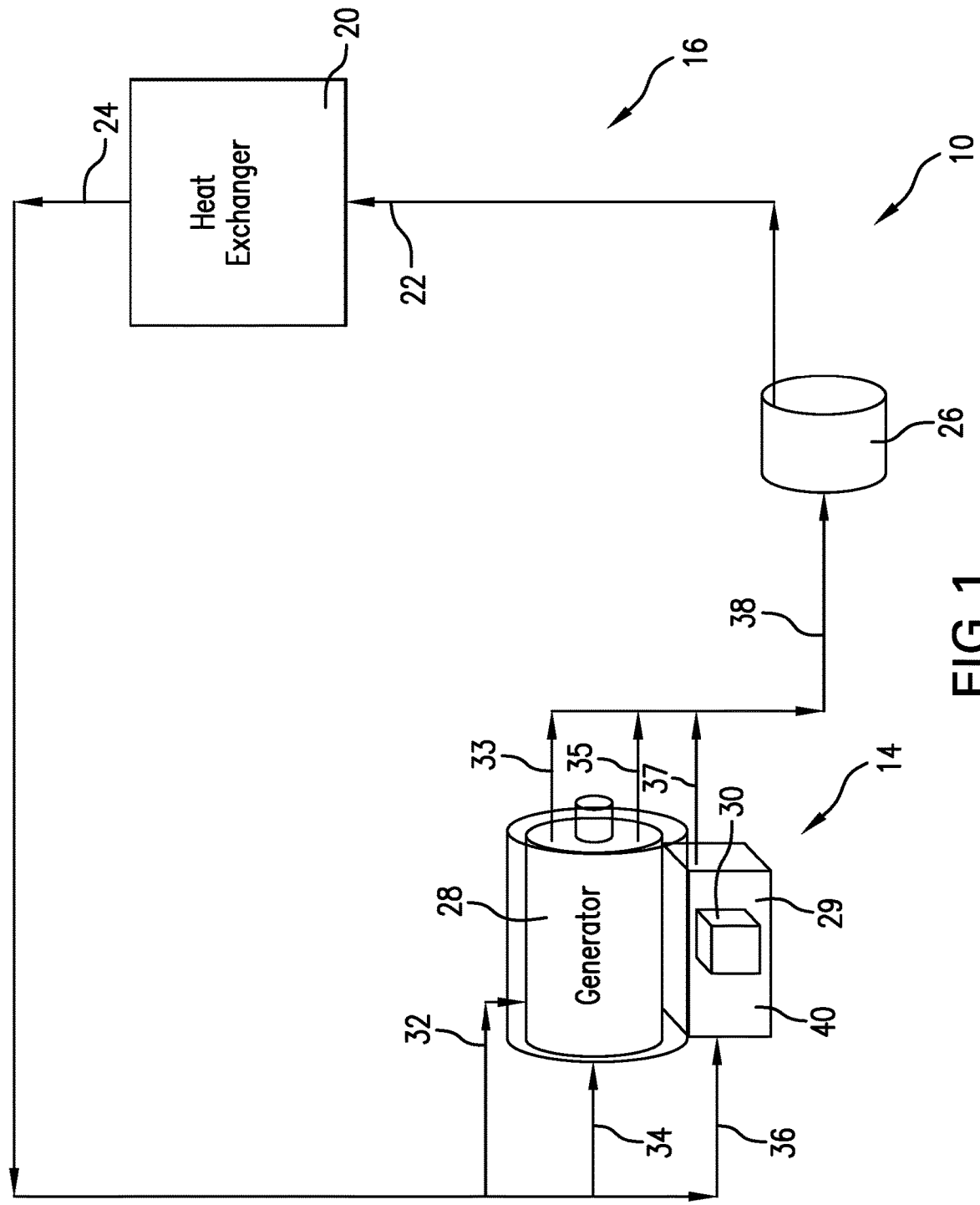
FIG. 1 depicts an electrical generation system including a transformer housing and cooling system, in accordance with an exemplary embodiment.

An electrical generation system, in accordance with an exemplary embodiment, is indicated generally at 10 in FIG. 1. Electrical generation system 10 includes an electrical generation portion 14 and a cooling system 16. Cooling system 16 operates to reduce temperatures associated with various components of electrical generation portion 14 as will be detailed herein. Cooling system 16 includes a heat exchanger 20 having an inlet 22 and an outlet 24. A cooling medium, such as air, water, gas or the like, passes through heat exchanger 20 to absorb heat from a cooling fluid passing from inlet 22 through outlet 24. Cooling system 16 also includes a pump 26 that operates to circulate the cooling fluid.

Electrical generation portion 14 includes a generator 28 and a converter 29 having a transformer 30. Transformer 30 may take the form of an inter-phase transformer employed in, for example, aircraft applications. In an embodiment, generator 28 includes a stator cooling flow inlet 32, a stator cooling flow outlet 33, a rotor cooling flow, inlet 34 and a rotor cooling flow outlet 35. Transformer 30 includes a converter cooling flow inlet 36 and a converter cooling flow outlet 37. Stator cooling flow outlet 33, rotor cooling flow outlet 35, and converter cooling flow outlet 37 fluidically connected to an inlet 38 of pump 26.

Figure 2:
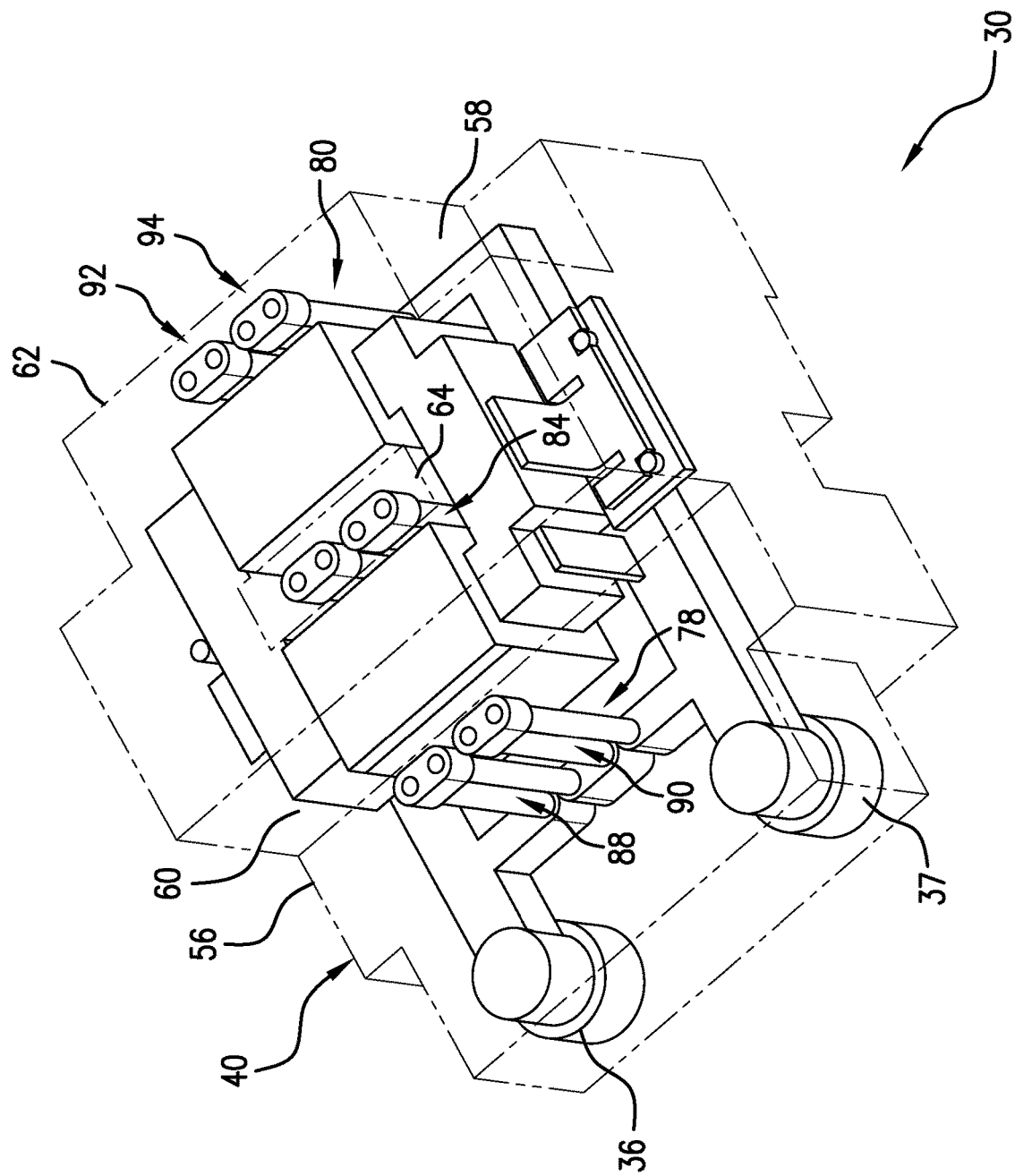
FIG. 2 is a partial upper left perspective view of the transformer housing of FIG. 1, in accordance with an exemplary embodiment.
Figure 3:
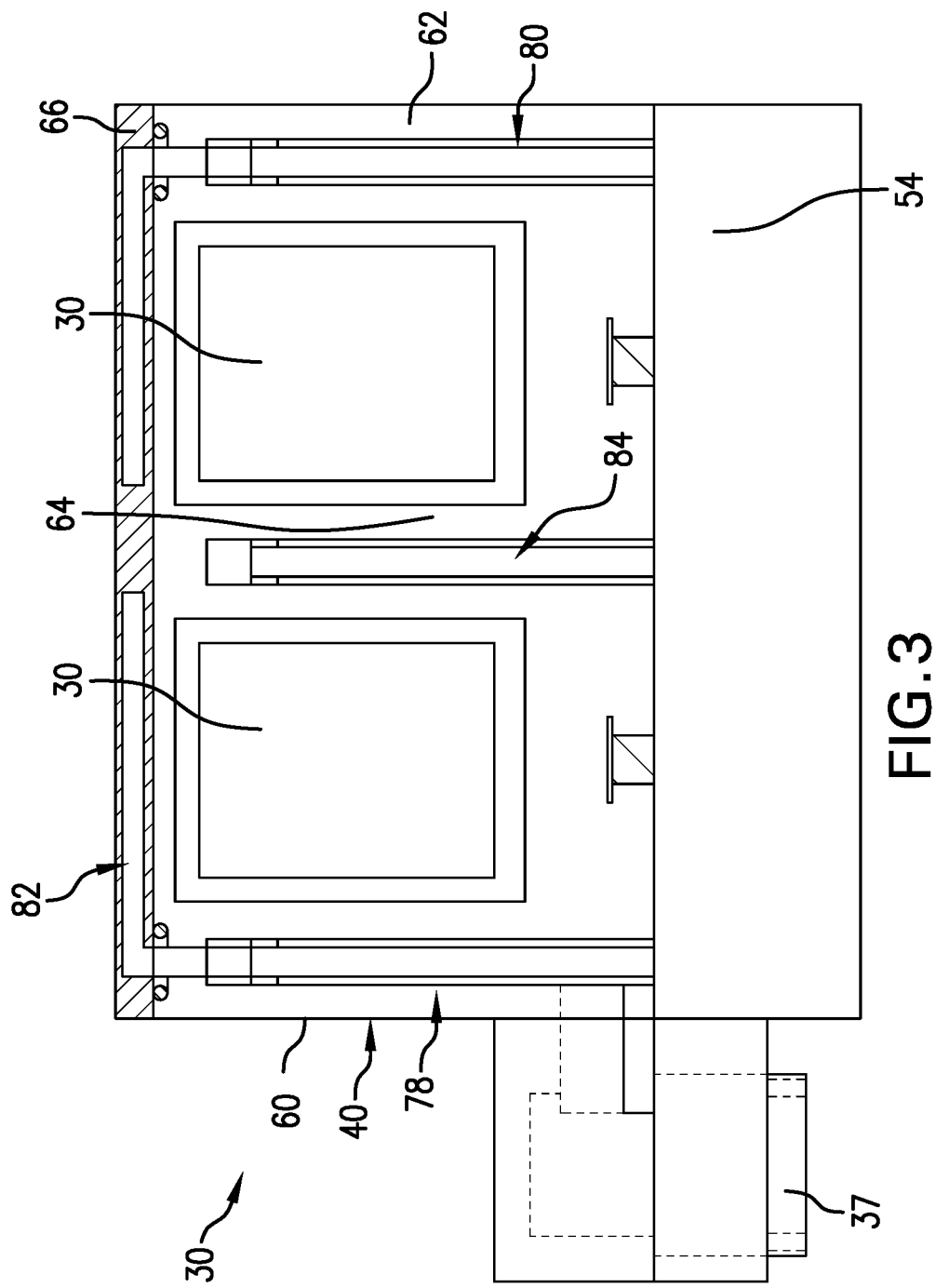
FIG. 3 depicts a plan view of the transformer housing, in accordance with an exemplary aspect.
Figure 4:
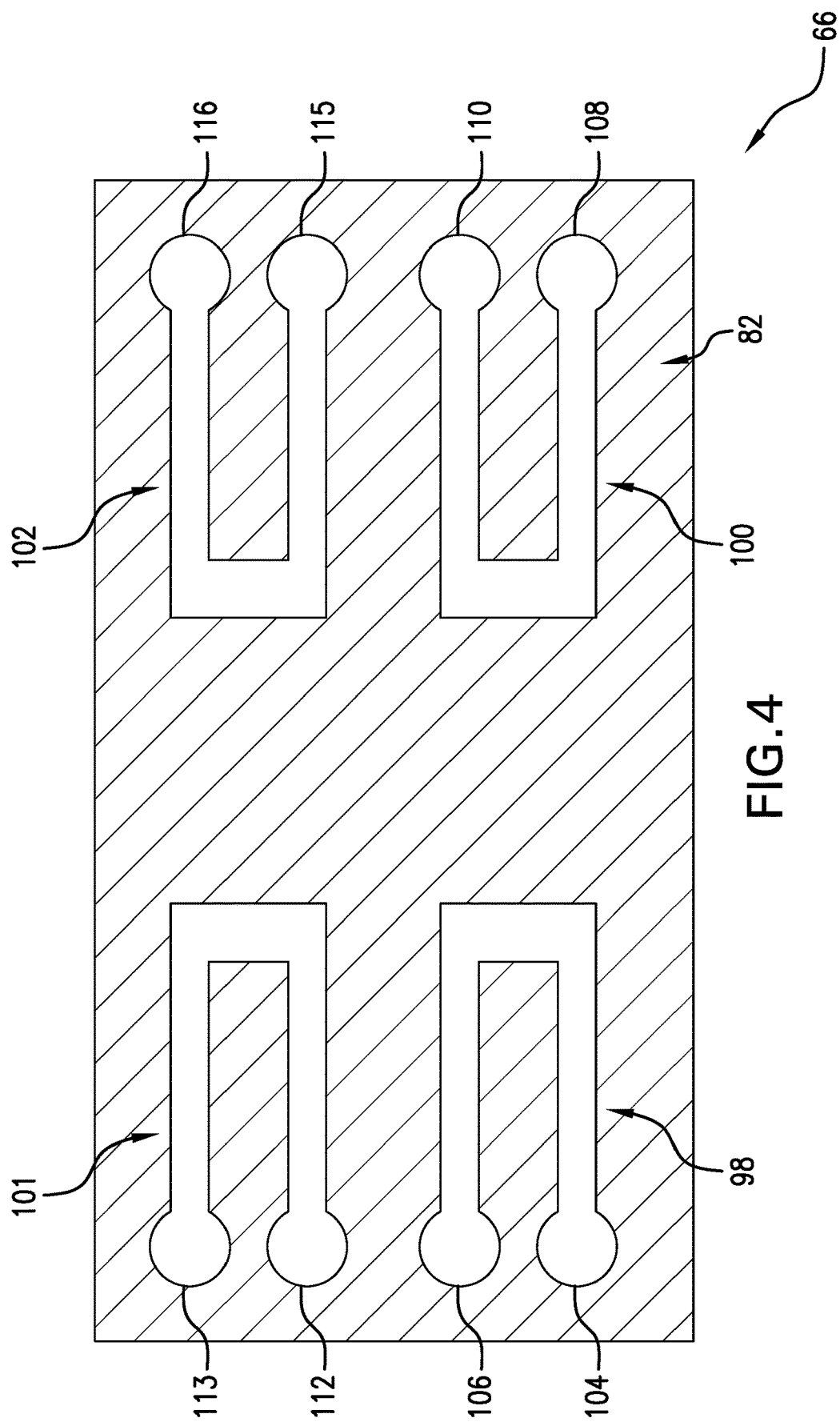
FIG. 4 depicts partial cross-sectional bottom view of a cover for the transformer housing, in accordance with an exemplary aspect.

Referring to FIGS. 2 and 3, transformer 30 includes a housing 40 having a base wall 54, a first side wall 56, a second side wall 58 positioned opposite to firsts side wall 56, a third side wall 60, and a fourth side wall 62 positioned opposite of third side wall 60. Third side wall 60 extends between and connects first ends (not separately labeled) of first side wall 56 and second side wall 58. Fourth side wall 62 extends between and connects second ends (also not separately labeled) of first side wall 56 and second side wall 58. A divider wall 64 extends between and connects mid points (not separately labeled) of first side wall 56 and second side wall 58. A cover 66 extends over each of first side wall 56, second side wall 58, third side wall 60, and fourth side wall 62.

In an embodiment, third side wall 60 supports a first cooling channel 78, fourth side wall 62 supports a second cooling channel 80, cover 66 supports a third cooling channel 82, and dividing wall 64 may support a fourth cooling channel 84. First cooling channel 78 includes a first coolant path 88 and a second coolant path 90. Second cooling channel 80 includes a third coolant path 92 and a fourth coolant path 94. Third cooling channel 82 includes a first coolant circuit 98, a second coolant circuit 100, a third coolant circuit 101, and a fourth coolant circuit 102. Potting compound may be disposed in the space between various walls and IPT components to allow for enhanced heat conduction from heat generating components to various walls with cooling channels disposed therein.

In an embodiment, first coolant circuit 98 is directly fluidically connected to first coolant path 88 via an inlet 104 and an outlet 106. Second cooling circuit 100 is directly fluidically connected to third coolant path 92 via an inlet section 108 and an outlet section 110. Third cooling circuit 101 is directly fluidically connected to second coolant path 90 via an inlet 112 and an outlet 113, and fourth coolant circuit 102 is directly fluidically connected to fourth coolant path 94 via an inlet section 115 and an outlet section 116. At this point, it should be understood that the term "directly fluidically connected" describes a coolant flow path that is entirely internal to housing 40. In an embodiment, seals (not shown) may be provided on cover 66 or upper portions of third side wall 60 and fourth side wall 62 to ensure that coolant does not leak.

Figure 5:
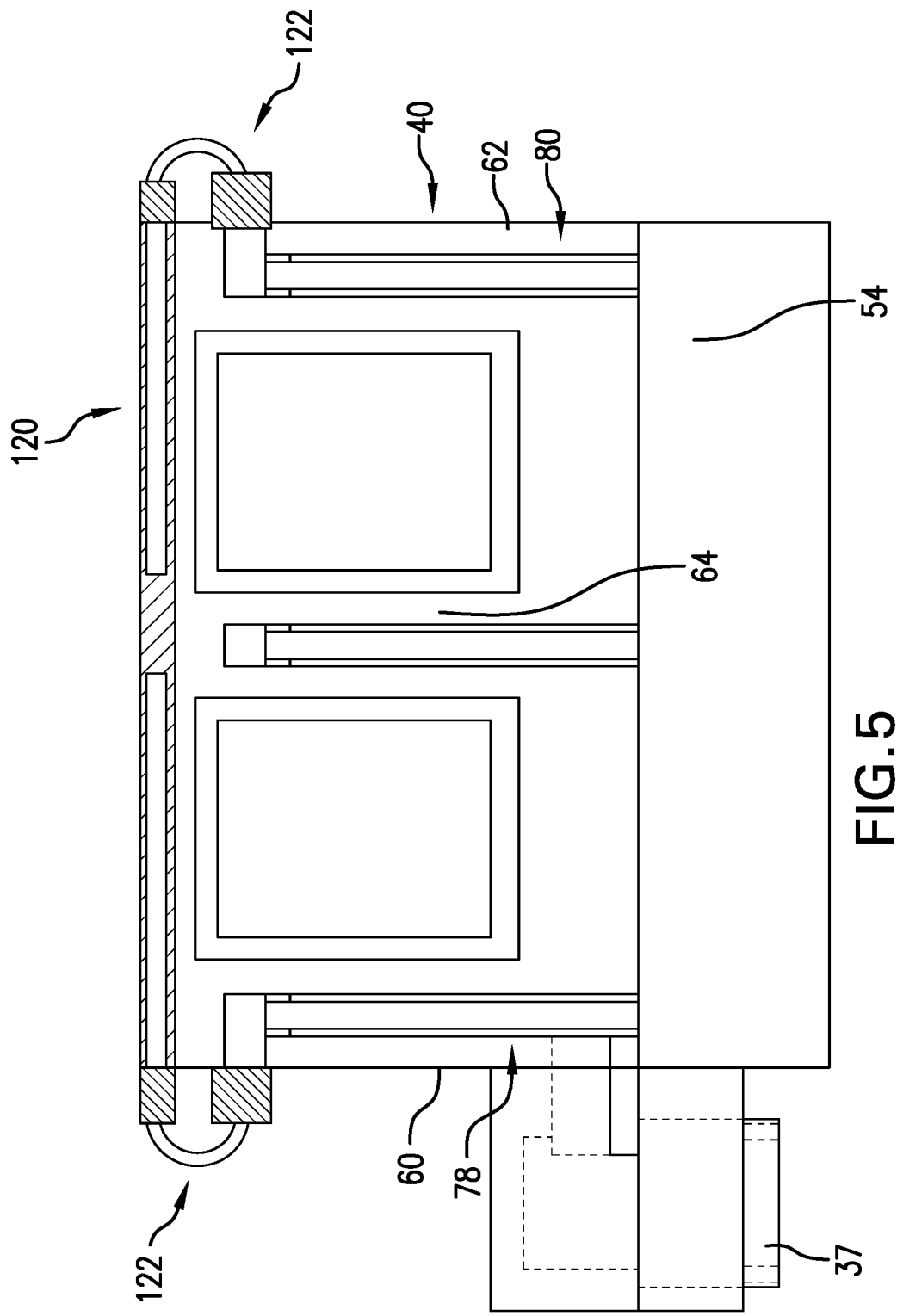
FIG. 5 depicts a plan view of the transformer housing, in accordance with another aspect of an exemplary embodiment.
Figure 6:
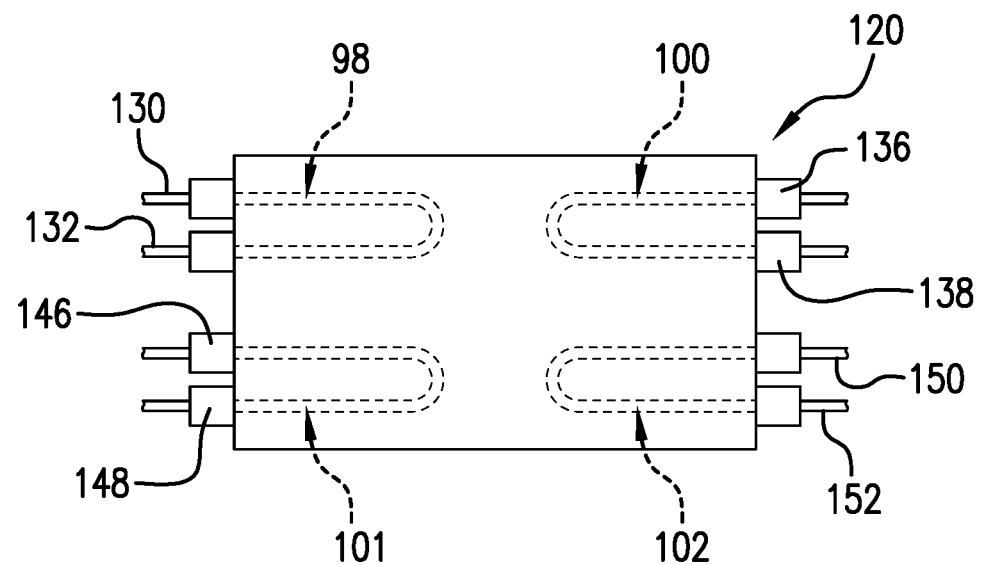
FIG. 6 depicts a top view of a cover for the transformer housing of FIG. 5, in accordance with an exemplary aspect.

In another embodiment depicted in FIGS. 5 and 6, wherein like reference numbers represent corresponding parts in the respective view, in describing a cover 120 in accordance with another exemplary aspect. Cover 120 includes external coolant connections 122. For example, first coolant circuit 98 may be coupled to first coolant flow path 88 via an inlet conduit 130 and an outlet conduit 132. Second coolant circuit 100 is connected to third coolant flow path 92 via an inlet conduit 136 and an outlet conduit 138. Third coolant circuit 101 is connected to second coolant flow path 90 via an inlet conduit 146 and an outlet conduit 148. Fourth coolant circuit 102 is connected to fourth coolant flow path 94 via an inlet conduit 150 and an outlet conduit 152. Conduits 130, 132, 136, 138, 146, 148, 150, and 152 represent an external flow path and may be joined to housing 40 via quick connects (not separately labeled). The quick disconnects allow cover 120 to be easily removed from housing 40.

At this point, it should be understood that the exemplary embodiments depict a system for removing heat from a transformer including added cooling circuits arranged in a housing cover. The cooling system also embeds cooling circuits in the housing itself. The incorporation of cooling in the housing cover allows for a greater range of electrical conversion with fewer temperature rise due to heat. Incorporating the cooling channels into the housing itself allows for the use of a wider range of cooling options including fluids that could not come into direct contact with electrical generating and conversion portions of the transformer.

The terms "about" and "substantially" are intended to include the degree of error associated with measurement of the particular quantity based upon the equipment available at the time of filing the application. For example, "about" and/or "substantially" can include a range of ±8% or 5%, or 2% of a given value.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A transformer comprising:
a housing having a base wall, a first side wall, a second side opposing wall, a third side wall extending between and joining the first side wall and the second side wall at a first end, and a fourth side wall extending between and joining the first side wall and the second side wall at a second end, the first, second, third, and fourth side walls collectively defining an interior portion;
a cover extending across each of the first side wall the second side wall, the third side wall, and the fourth side wall; and
a cooling system including a first cooling channel disposed in the third side wall, a second cooling channel disposed in the fourth side wall, and a third cooling channel disposed in the cover, the third cooling channel being directly fluidically connected to at least one of the first cooling channel and the second cooling channel.

2. The transformer according to claim 1, wherein the third cooling channel includes a first cooling circuit fluidically connected to the first cooling channel and a second cooling circuit fluidically connected to the second cooling channel.

3. The transformer according to claim 2, wherein the first cooling channel includes a first coolant path and a second coolant path and the second coolant channel includes a third coolant path and a fourth coolant path.

4. The transformer according to claim 3, wherein the first cooling circuit includes an inlet fluidically connected to the first coolant path and an outlet fluidically connected to the first coolant path.

5. The transformer according to claim 3, wherein the second cooling circuit includes an inlet section fluidically connected to the third coolant path and an outlet section fluidically connected to the third coolant path.

6. The transformer according to claim 2, wherein the first cooling circuit is directly fluidically connected to the first cooling channel and the second cooling circuit is directly fluidically connected to the second cooling channel.

7. The transformer according to claim 2, wherein the first cooling circuit is fluidically connected to the first cooling channel via a first conduit and the second cooling circuit is fluidically connected to the second cooling channel via a second conduit.

8. The transformer according to claim 7, wherein the first conduit passes externally of the housing and the second conduit passes externally of the housing.

9. An electrical generation system comprising:
a heat exchanger;
a pump fluidically connected to the heat exchanger;
a generator including a cooling circuit fluidically connected to the pump; and
a transformer electrically connected to the generator and fluidically connected to the pump, the transformer comprising:
a housing having a base wall, a first side wall, a second side opposing wall, a third side wall extending between and joining the first side wall and the second side wall at a first end, and a fourth side wall extending between and joining the first side wall and the second side wall at a second end, the first, second, third, and fourth side walls collectively defining an interior portion;
a cover extending across each of the first side wall the second side wall, the third side wall, and the fourth side wall; and
a cooling system including a first cooling channel disposed in the third side wall, a second cooling channel disposed in the fourth side wall, and a third cooling channel disposed in the cover, the third cooling channel being directly fluidically connected to at least one of the first cooling channel and the second cooling channel.

10. The electrical generation system according to claim 9, wherein the third cooling channel includes a first cooling circuit fluidically connected to the first cooling channel and a second cooling circuit fluidically connected to the second cooling channel.

11. The electrical generation system according to claim 10, wherein the first cooling channel includes a first coolant path and a second coolant path and the second coolant channel includes a third coolant path and a fourth coolant path.

12. The electrical generation system according to claim 11, wherein the first cooling circuit includes an inlet fluidically connected to the first coolant path and an outlet fluidically connected to the first coolant path.

13. The electrical generation system according to claim 11, wherein the second cooling circuit includes an inlet section fluidically connected to the third coolant path and an outlet section fluidically connected to the third coolant path.

14. The electrical generation system according to claim 10, wherein the first cooling circuit is directly fluidically connected to the first cooling channel and the second cooling circuit is directly fluidically connected to the second cooling channel.

15. The electrical generation system according to claim 10, wherein the first cooling circuit is fluidically connected to the first cooling channel via a first and the second cooling circuit is fluidically connected to the second cooling channel via a second conduit.

16. The electrical generation system according to claim 15, wherein the first conduit passes externally of the housing and the second conduit passes externally of the housing.

17. The transformer according to claim 1, wherein the cover is detachably connected to the first side wall, the second side wall, the third side wall, and the fourth side wall.

18. The transformer according to claim 1, wherein the transformer includes a first coil and a second coil, the housing including a divider wall that extend between the first coil and the second coil, the divider wall including a fourth cooling channel.

* * * * *